(12) United States Patent
Kim et al.

(10) Patent No.: US 6,893,914 B2
(45) Date of Patent: May 17, 2005

(54) METHOD FOR MANUFACTURING SEMICONDUCTOR DEVICE

(75) Inventors: Gyu Hyun Kim, Seoul (KR); Hyo Geun Yoon, Gyeonggi-do (KR); Geun Min Choi, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/603,895

(22) Filed: Jun. 25, 2003

(65) Prior Publication Data

US 2004/0110340 A1 Jun. 10, 2004

(30) Foreign Application Priority Data

Jun. 29, 2002 (KR) ................................ 10-2002-0037752

(51) Int. Cl.[7] ......................................... H01L 21/8242
(52) U.S. Cl. ....................................... 438/241; 438/254
(58) Field of Search ............................... 438/210, 241, 438/253, 254, 396, 397

(56) References Cited

U.S. PATENT DOCUMENTS

| | | | |
|---|---|---|---|
| 5,396,456 A | 3/1995 | Liu et al. | 257/296 |
| 5,851,878 A | 12/1998 | Huang | 438/255 |
| 5,956,587 A | 9/1999 | Chen et al. | |
| 6,074,910 A | 6/2000 | Lin | 438/254 |
| 6,077,738 A * | 6/2000 | Lee et al. | 438/241 |
| 6,372,572 B1 * | 4/2002 | Yu et al. | 438/254 |
| 6,461,911 B2 | 10/2002 | Ahn et al. | 438/241 |
| 6,475,858 B2 * | 11/2002 | Sugiyama et al. | 438/241 |

FOREIGN PATENT DOCUMENTS

| | | |
|---|---|---|
| JP | 5275643 | 10/1993 |
| JP | 7312416 | 12/1995 |
| JP | 9307080 | 10/1998 |
| KR | 010059461 A | 7/2001 |

OTHER PUBLICATIONS

Korean Intellectual Property Office Notice of Rejection dated Jul. 30, 2004.

* cited by examiner

*Primary Examiner*—Chandra Chaudhari
(74) *Attorney, Agent, or Firm*—Marshall, Gerstein & Borun LLP

(57) ABSTRACT

A method for manufacturing a semiconductor device wherein a cylindrical capacitor is formed by selectively etching an oxide film in a cell area for preventing bridging between cells during a wet etching process of the oxide film in the cell area is described herein. A step difference between the interlayer insulating film formed in the cell area and the interlayer insulating film formed in the peripheral circuit area is minimized by covering the peripheral circuit area by the photoresist film and selectively etching the oxide film in the cell area to form a cylindrical capacitor, thereby simplifying the manufacturing process. In addition, bridging between the cells is prevented by performing a simple wet etching process using a single wet station, without performing a separate dry etching process for removing the oxide film and the photoresist film pattern, thereby improving the yield of the device.

24 Claims, 21 Drawing Sheets

METHOD FOR MANUFACTURING SEMICONDUCTOR DEVICE

BACKGROUND

Technical Field

A method for manufacturing a semiconductor device is disclosed wherein a cylindrical capacitor is formed by selectively etching an oxide film in a cell area for preventing bridging between cells during a wet etching process of the oxide film in the cell area.

FIGS. 1a to 1n are cross-sectional diagrams illustrating sequential steps of a conventional method for manufacturing a semiconductor device.

Referring to FIG. 1a, an interlayer insulating film 14 having a storage electrode contact 12 therein is formed on a semiconductor substrate 10 having a device isolation film (not shown), a word line (not shown) and a bit line (not shown) thereon. A nitride film 16, an oxide film 18, a hard mask 20 and a photoresist film (not shown) are sequentially formed on the interlayer insulating film 14, and the photoresist film is then patterned via a photolithography process to form a photoresist film pattern 22.

Referring to FIG. 1b, the hard mask 20, the oxide film 18 and the nitride film 16 are sequentially dry etched according to a conventional method using the photoresist film pattern 22 as a mask, to define a cell area C and a peripheral circuit area C.

Referring to FIG. 1c, the photoresist film pattern 22 and the hard mask 20 remaining after the dry etching process are removed.

Referring to FIG. 1d, a polysilicon layer (not shown) is deposited on the entire surface of the resulting structure, and then isolated via a chemical mechanical polishing (CMP) process to form a storage electrode 24.

Referring to FIG. 1e, the oxide film 18 in the cell area C and the peripheral circuit area P is removed by wet etching process so that only a storage electrode 24 remains.

Referring to FIG. 1f, a dielectric film 28 is formed by depositing a dielectric substance on the storage electrode 24.

Referring to FIG. 1g, a plate electrode 30 is formed by depositing a polysilicon layer on the dielectric film 28.

Referring to FIG. 1h, a photoresist film (not shown) is deposited on the entire surface of the resulting structure, and then selectively exposed and developed to form a plate mask 26 in a predetermined area of the plate electrode 30.

Referring to FIG. 1i, the plate electrode 30 is etched by using the plate mask 26, and then the plate mask 26 is removed.

Referring to FIG. 1j, an interlayer insulating film 36 is formed on the entire surface of the resulting structure. Large step difference is generated between the interlayer insulating film 36 formed in the cell area C and the interlayer insulating film 36 formed in the peripheral circuit area P. The step difference is required to be removed in a subsequent process.

Referring to FIG. 1k, a photoresist film (not shown) is deposited on the entire surface of the resulting structure. The photoresist film is then exposed and developed, to form a cell mask 34 on the interlayer insulating film 36 in the peripheral circuit area P.

Referring to FIG. 1l, the interlayer insulating film 36 in the cell area C is partially removed via a dry etching process using the cell mask 34.

Referring to FIG. 1m, the interlayer insulating film 36 under the cell mask 34 is partially removed by wet etching process.

Referring to FIG. 1n, the cell mask 34 is removed to form the interlayer insulating film 36 having its large step difference removed.

As described above, when the cylindrical capacitor is manufactured and the interlayer insulating film is formed on the resulting structure, a large step difference occurs between the interlayer insulating film formed in the cell area C and the interlayer insulating film formed in the peripheral circuit area P.

Additional processes are required to remove the large step difference, resulting in complication of the manufacturing process.

SUMMARY OF THE DISCLOSURE

A method for manufacturing a semiconductor device is disclosed wherein a cylindrical capacitor is formed by covering a peripheral circuit area with a photoresist film and selectively etching an oxide film in a cell area, and uses a new etching process for preventing bridging between cells from occurring when the oxide film is dried after the wet etching process is disclosed herein.

The method for manufacturing the semiconductor device comprises: (a) forming an oxide film for storage electrode on the entire surface of a semiconductor substrate comprising a cell area and a peripheral circuit area; (b) etching the oxide film for storage electrode in the cell area to define a storage electrode area; (c) forming a storage electrode in the storage electrode area; (d) forming a photoresist film pattern on the oxide film for storage electrode in the peripheral circuit area; (e) removing the oxide film for a storage electrode in the cell area via a wet etching process using the photoresist film pattern as a mask, and removing the photoresist film pattern; (f) sequentially forming a dielectric film and a plate electrode on the entire surface of the resulting structure; and (g) forming an interlayer insulating film on the entire surface of the resulting structure.

The removing of the oxide film for a storage electrode in the cell area may employ a BOE (Buffered Oxide Etchant) solution bath using the photoresist film pattern as a mask, and the removing of the photoresist film pattern of the resulting structure may be performed in a Piranha solution bath, and may further comprise cleaning the resulting structure in an SC-1 solution bath and cleaning the resulting structure in a diluted HF solution bath.

In addition, the removing of the oxide film for a storage electrode in the cell area may employ a BHF (Buffered Hydrogen Fluoride) solution bath by using the photoresist film pattern as a mask, and cleaning the resulting structure in a pure water bath, and the removing of the photoresist film pattern of the resulting structure may be performed in a Piranha solution bath, and may further comprise cleaning the resulting structure in a pure water bath, and drying the resulting structure in a dryer.

According to another embodiment, a disclosed method may comprise: (a) removing an oxide film for a storage electrode in a cell area of a semiconductor substrate, wherein a storage electrode is disposed in the cell area, and a photoresist film pattern is disposed in peripheral circuit region of the semiconductor substrate by performing a wet etching process in a BHF (Buffered Hydrogen Fluoride) solution bath; (b) cleaning the resulting structure in a pure water bath; (c) removing the photoresist film pattern in a Piranha solution bath; (d) cleaning the resulting structure in a pure water bath; and (e) drying the resulting structure.

BRIEF DESCRIPTION OF THE DRAWINGS

The disclosure will be described in terms of several embodiments to illustrate its broad teachings. Reference is also made to the attached drawings, wherein.

DETAILED DESCRIPTION

The present disclosure will be described in detail with reference to the accompanying drawings.

FIGS. 2a to 2l are cross-sectional diagrams illustrating sequential steps of a method for manufacturing a semiconductor device in accordance with the present invention.

Figure 1A:
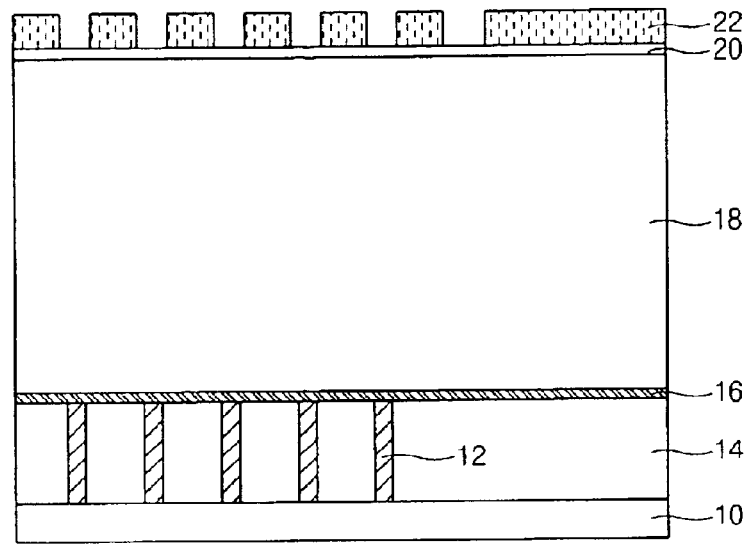
FIGS. 1a to 1n are cross-sectional diagrams illustrating sequential steps of a conventional method for manufacturing a semiconductor device.
Figure 1B:
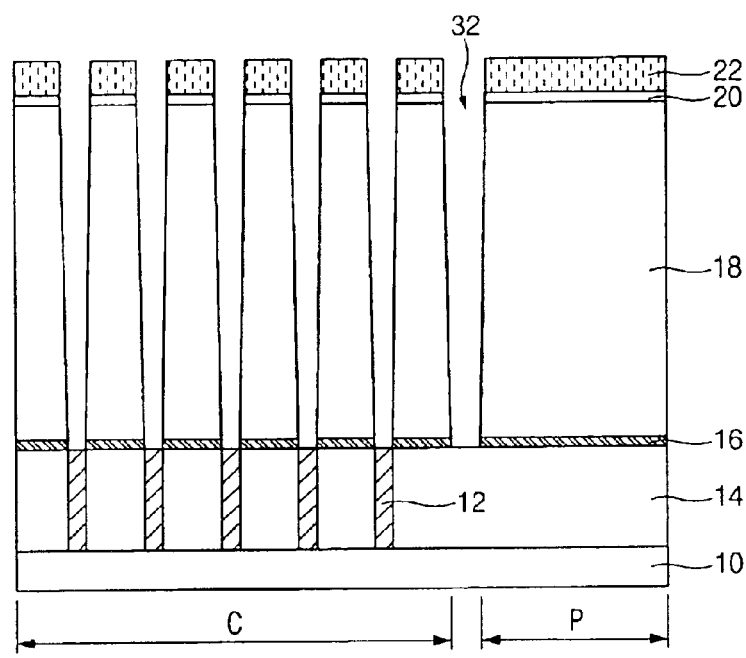
Figure 1C:
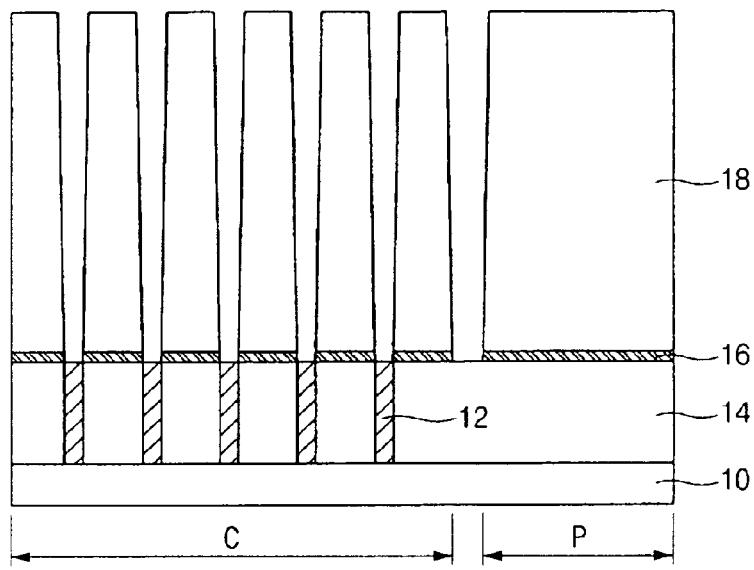
Figure 1D:
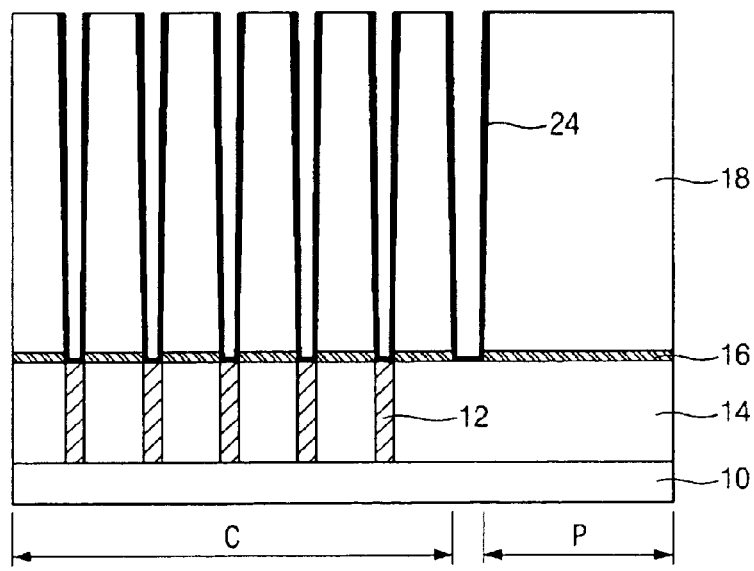
Figure 1E:
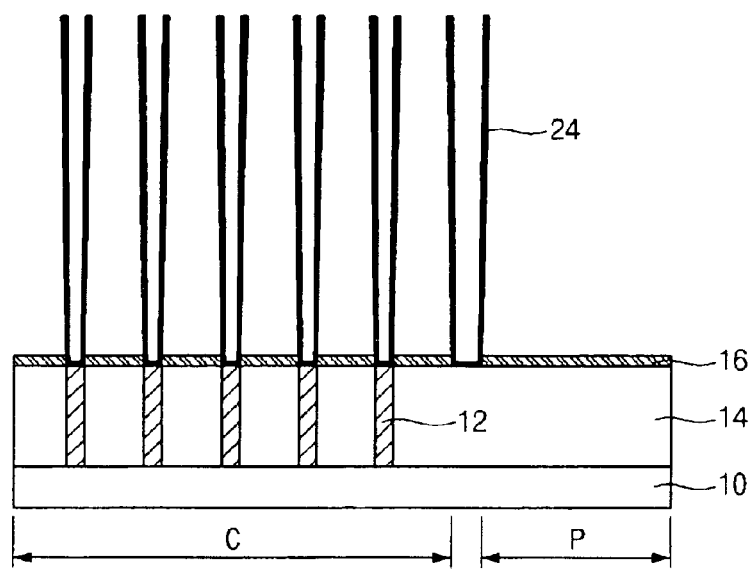
Figure 1F:
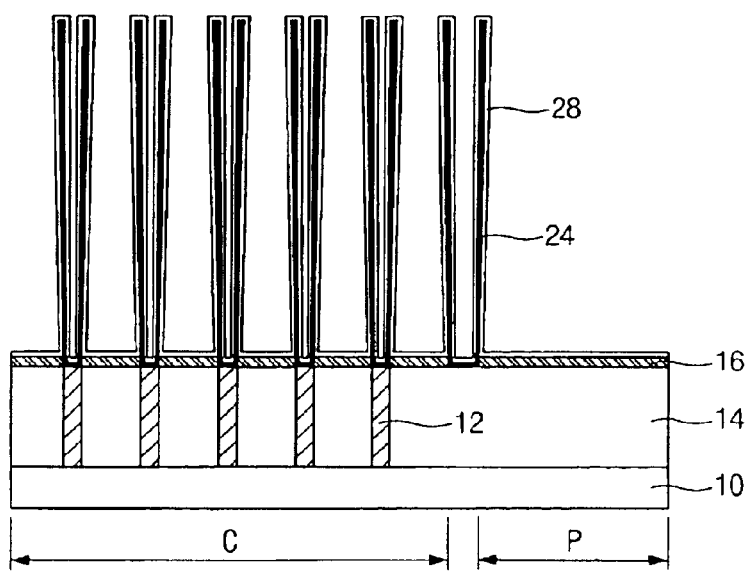
Figure 1G:
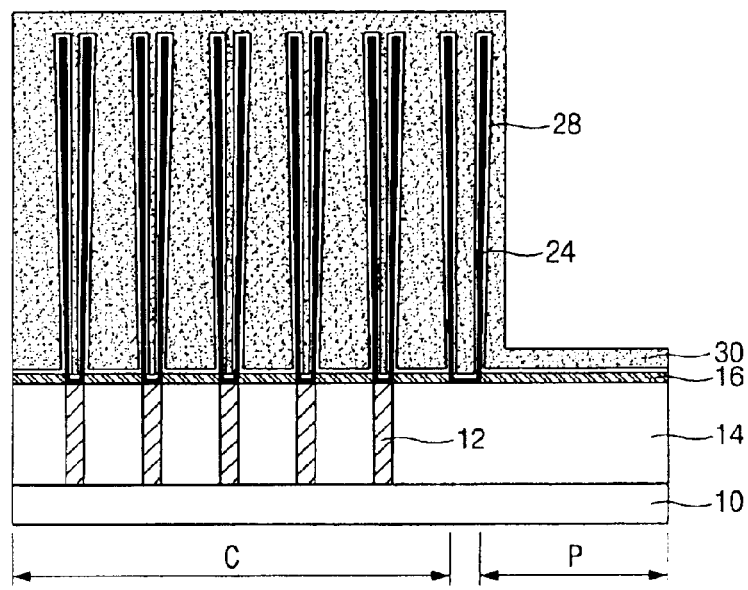
Figure 1H:
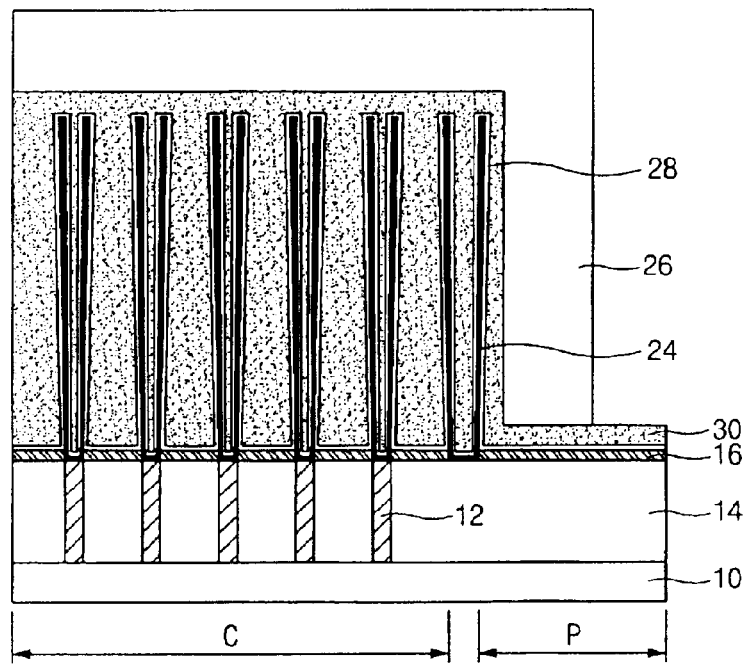
Figure 1I:
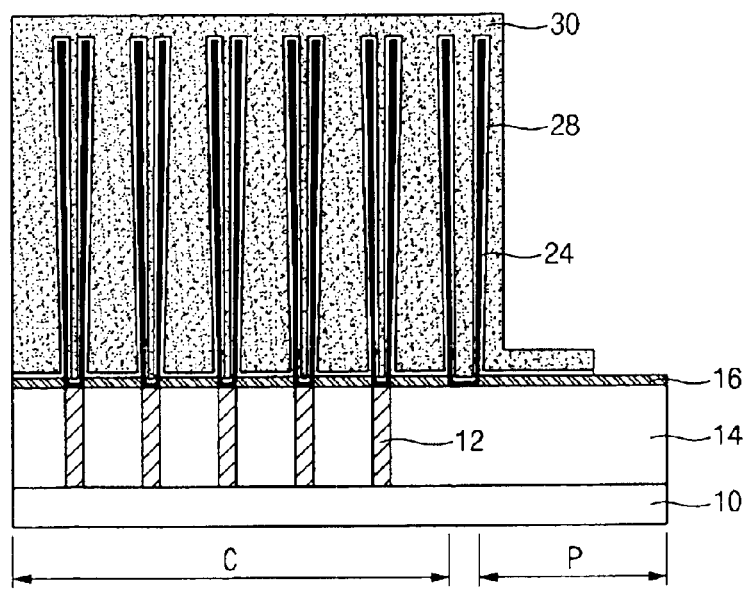
Figure 1J:
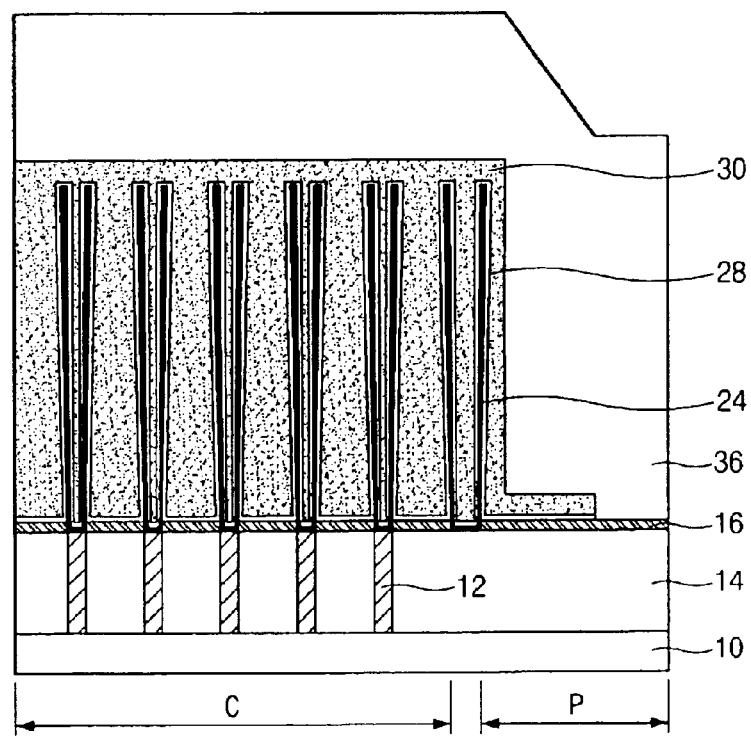
Figure 1K:
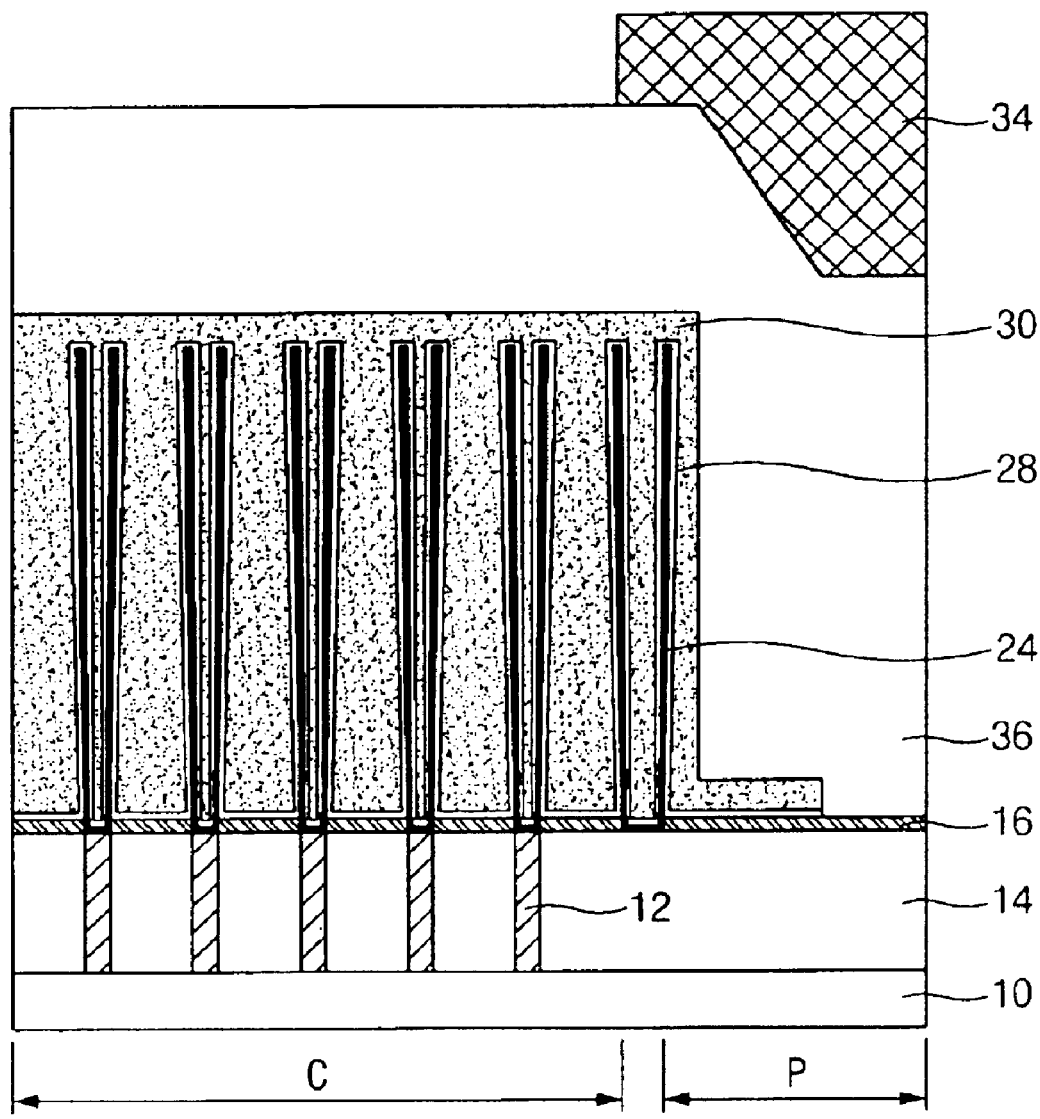
Figure 1I:
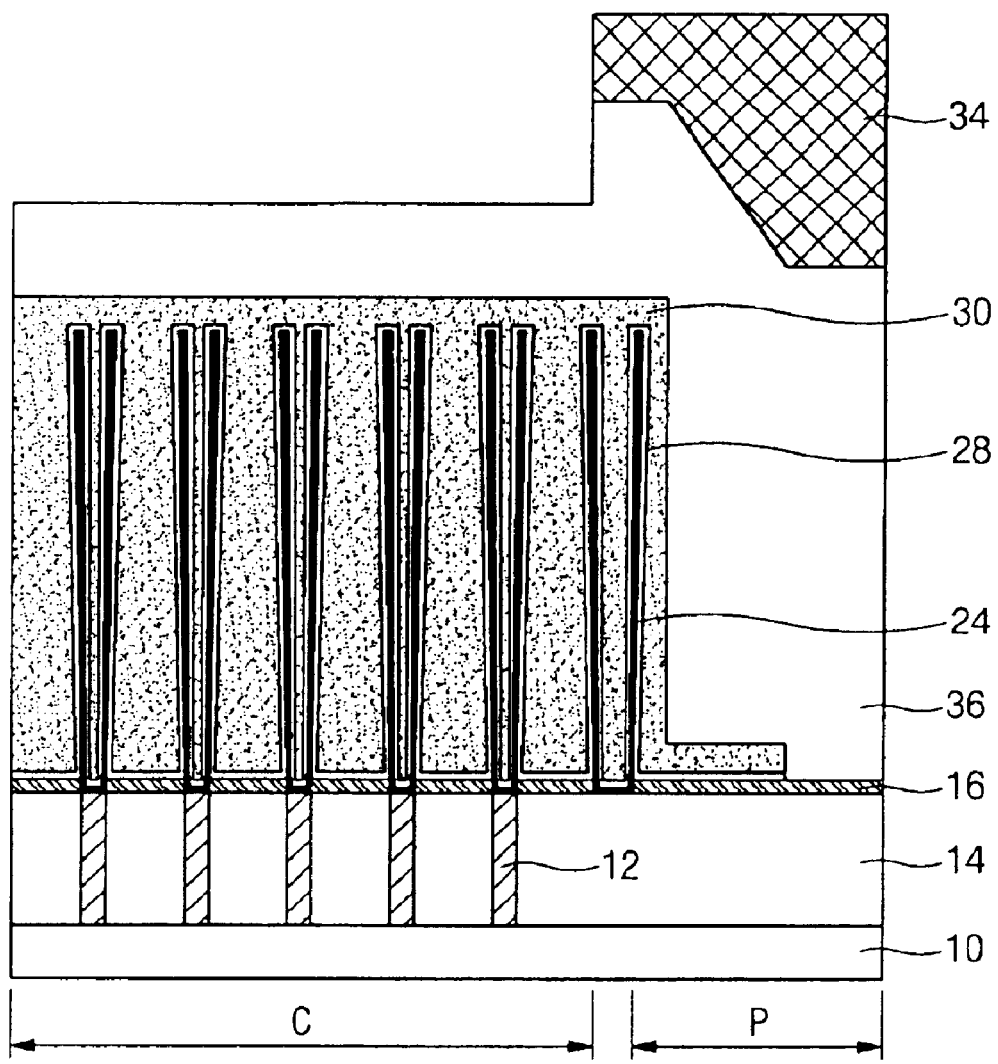
Figure 1M:
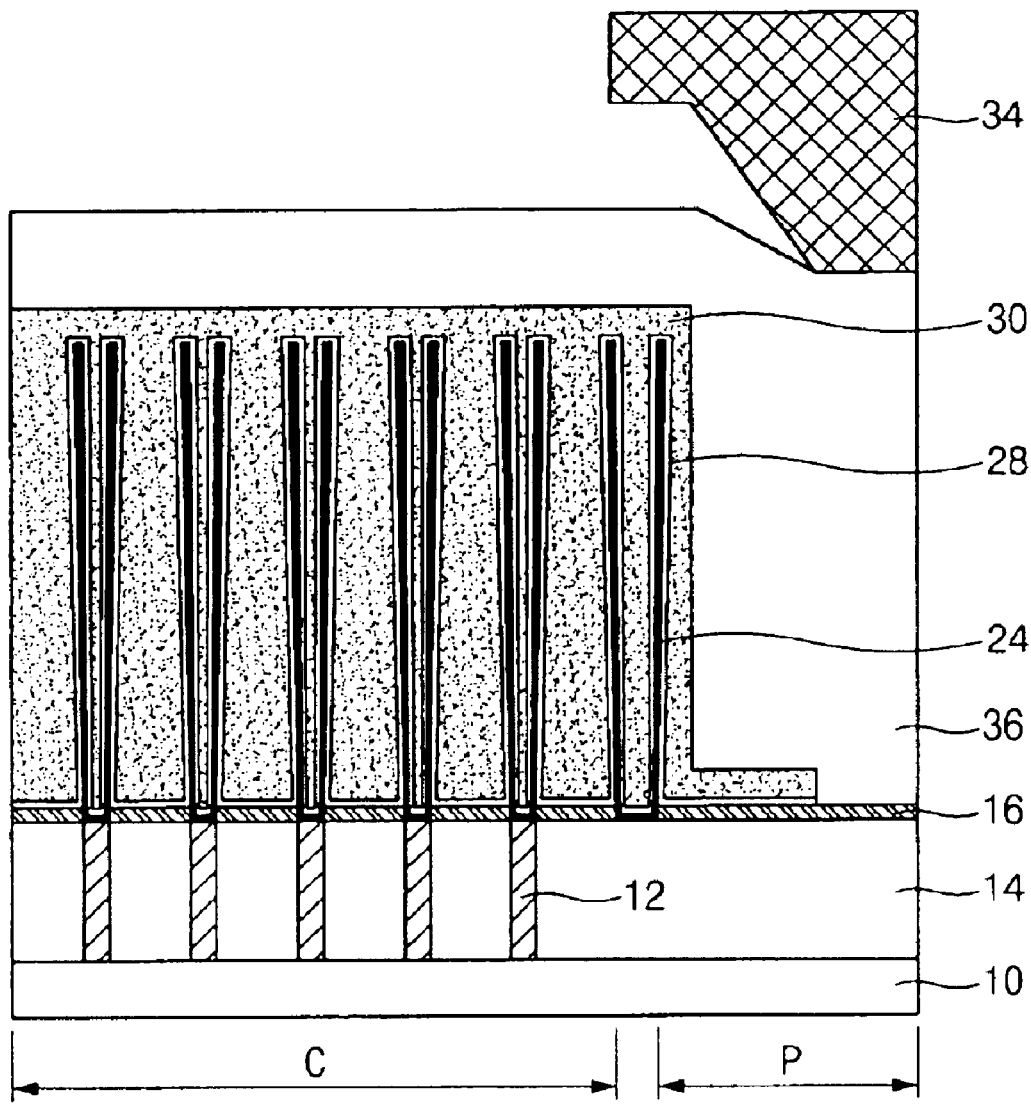
Figure 1N:
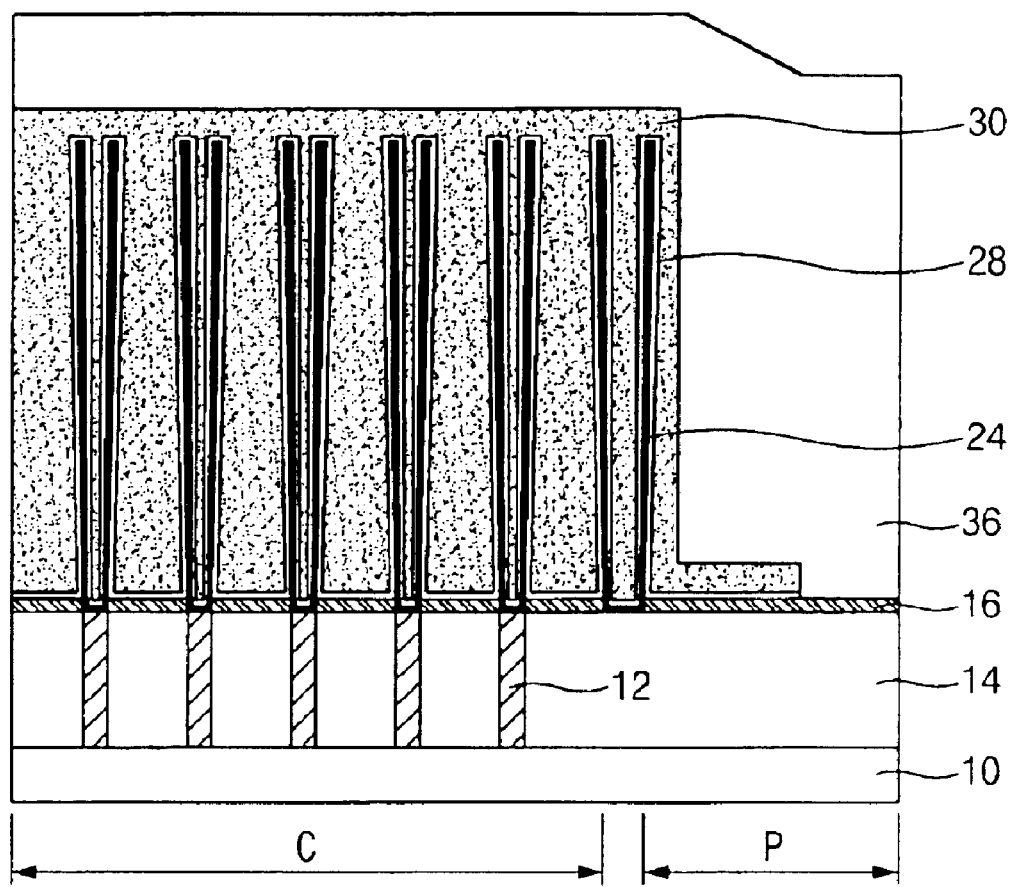
Figure 2A:
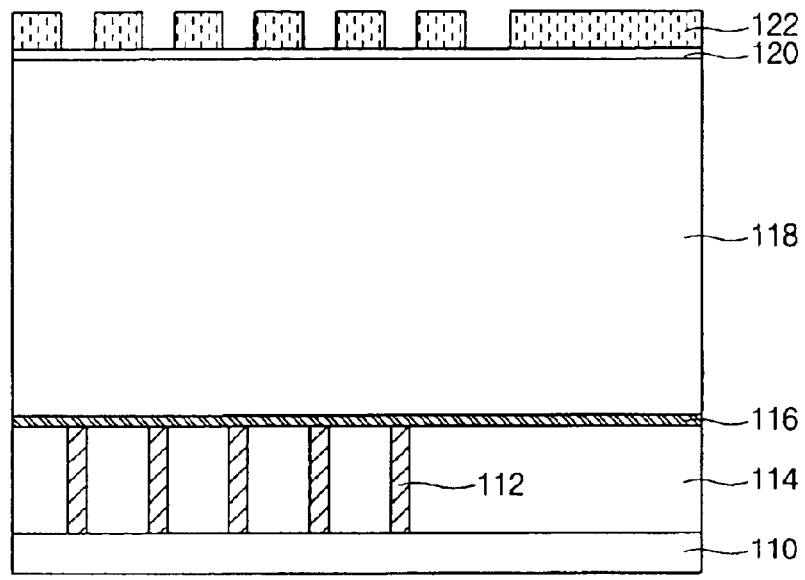
FIGS. 2a to 2l are cross-sectional diagrams illustrating sequential steps of a method for manufacturing a semiconductor device in accordance with the present invention.

Referring to FIG. 2a, an interlayer insulating film 114 having a storage electrode contact 112 therein is formed on a semiconductor substrate 110 having a device isolation film (not shown), a word line (not shown) and a bit line (not shown) thereon. A nitride film 116, an oxide film 118, a hard mask 120 and a photoresist film (not shown) are sequentially formed on the interlayer insulating film 114, and the photoresist film is then patterned via a photolithography process to form a photoresist film pattern 122.

Figure 2B:
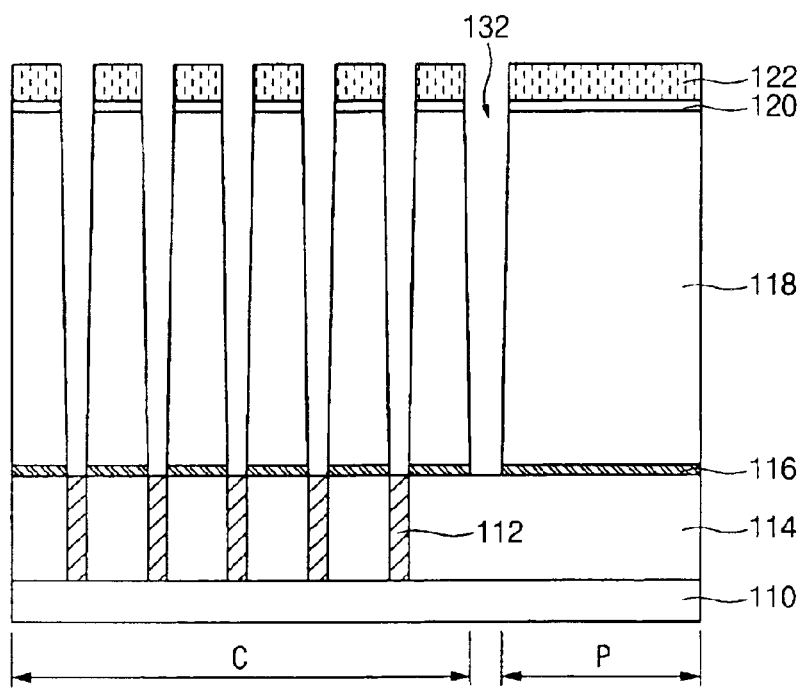

Referring to FIG. 2b, the hard mask 120, the oxide film 118 and the nitride film 116 are sequentially dry etched according to a conventional method using the photoresist film pattern 122 as a mask, to define a cell area C and a peripheral circuit area C. Here, a guard ring 132 defined between the cell area C and the peripheral circuit area P is covered by the photoresist film to prevent wet etching of the oxide film 118 in the peripheral circuit area P during a succeeding wet etching process of the oxide film 118 in the cell area C.

Figure 2C:
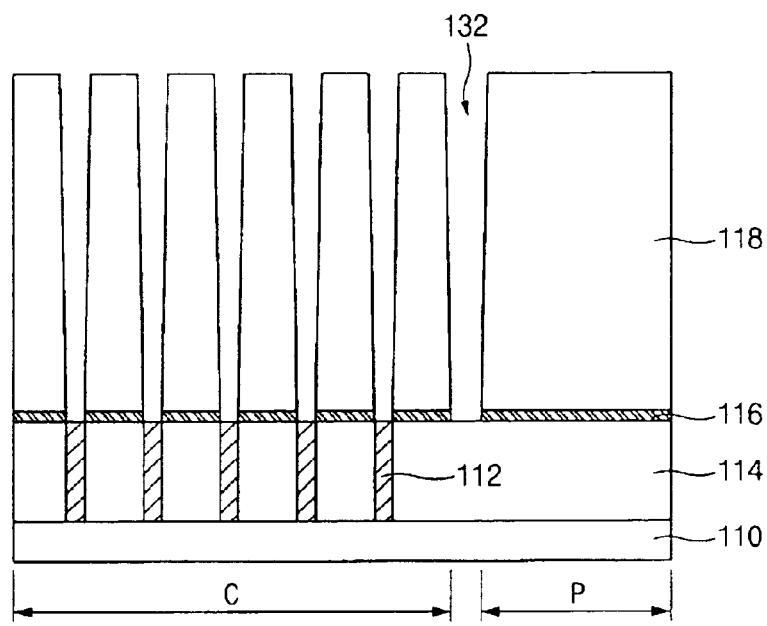

Referring to FIG. 2c, the photoresist film pattern 122 and the hard mask 120 remaining after the dry etching process are removed.

Figure 2D:
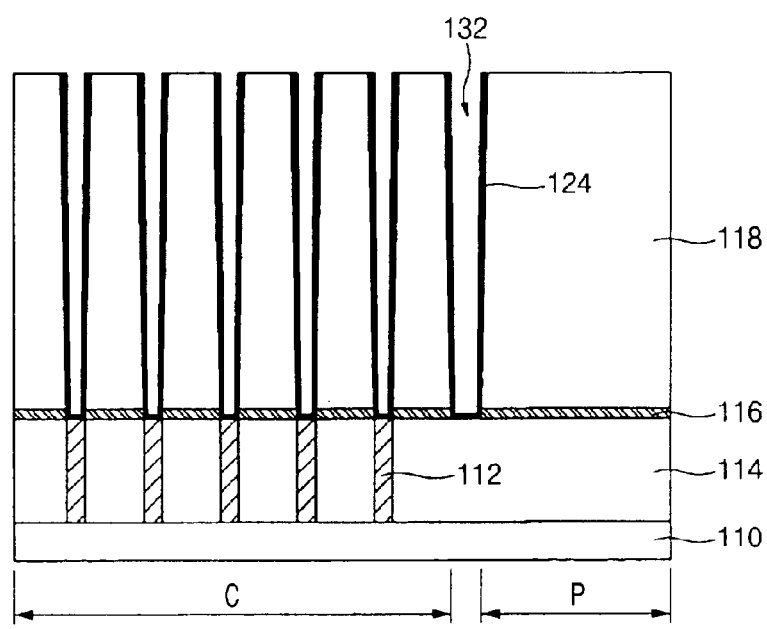

Referring to FIG. 2d, a polysilicon layer (not shown) is deposited on the entire surface of the resulting structure, and then isolated via a chemical mechanical polishing (CMP) process to form a storage electrode 124.

Figure 2E:
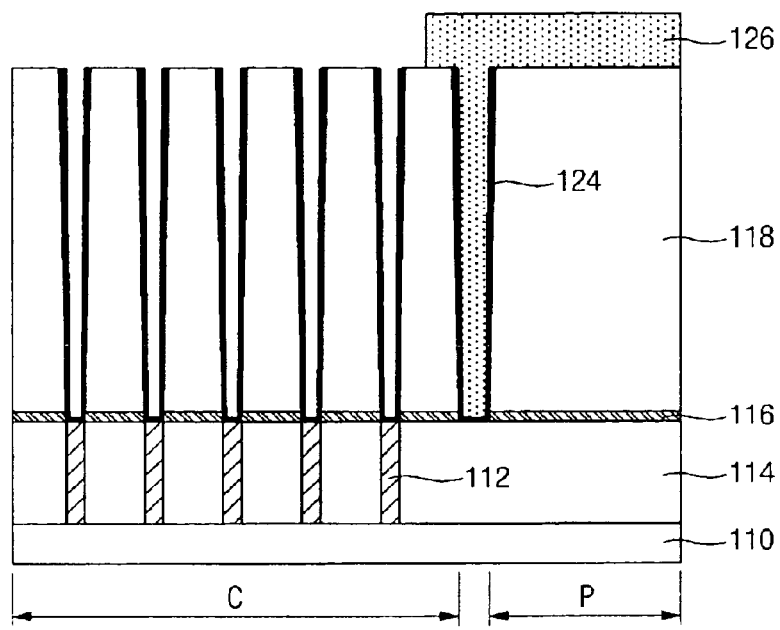

Referring to FIG. 2e, a photoresist film (not shown) is deposited on the entire surface of the resulting structure, and then selectively exposed and developed to form a "dip out" mask 126 which is a photoresist film pattern in the guard ring 132 and the peripheral circuit area P.

Figure 2F:
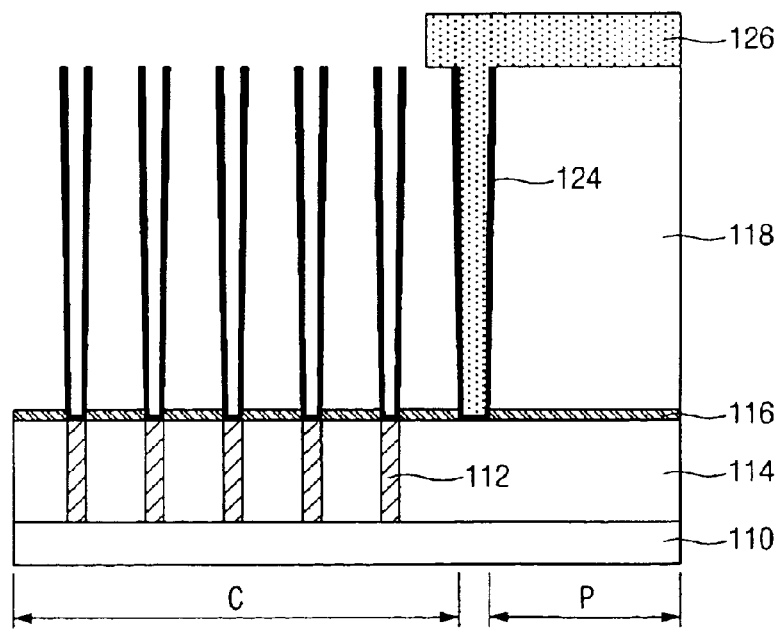

Referring to FIG. 2f, the oxide film 118 in the cell area C is removed by wet etching process.

Figure 2G:
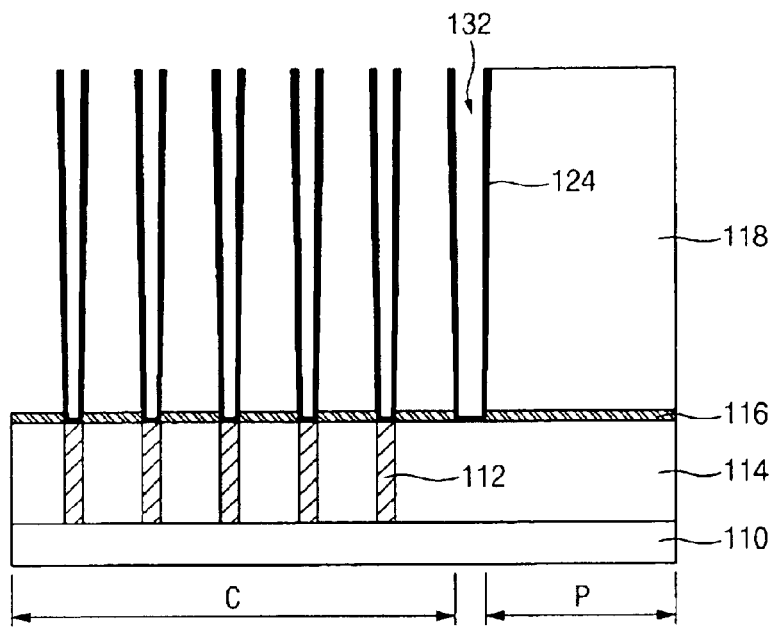

Referring to FIG. 2g, the dip out mask 126 is removed by wet etching process so that only the storage electrode 124 remains.

The wet etching processes of FIGS. 2f and 2g may be performed in a single wet station including a buffered oxide etchant (BOE) solution bath, a Piranha solution bath, an SC-1 solution bath and a diluted HF solution bath. In case of the wet etching process of the oxide film 118 in the cell area C shown in FIG. 2f, the wet etching process is preferably performed in the BOE solution bath, and in case of the wet etching process of the dip out mask 126 shown in FIG. 2g, the wet etching process is preferably performed in the Piranha solution bath, the SC-1 solution bath and the diluted HF solution bath.

In addition, the wet etching processes of FIGS. 2f and 2g may be performed in a single wet station including a buffered hydrogen fluoride (BHF) solution bath, a pure water bath, a Piranha solution bath, a pure water bath and a dryer. In case of the wet etching process of the oxide film 118 in the cell area C shown in FIG. 2f, the wet etching process is preferably performed in the BHF solution bath and pure water bath, and in case of the wet etching process of the dip out mask 126 shown in FIG. 2g, the wet etching process is preferably performed in the Piranha solution bath, the pure water bath and the dryer.

The Piranha solution consists of $H_2SO_4$ and $H_2O_2$. Preferably, the volume ratio of $H_2SO_4$ to $H_2O_2$ is in the range of 2:1 to 6:1, and the temperature of the Piranha solution ranges from 90 to 130° C., and more preferably, the volume ratio of $H_2SO_4$ to $H_2O_2$ is 4:1, and the temperature of the Piranha solution is about 120° C.

The oxidation of the surface of the storage electrode 124, namely conversion from hydrophobicity to hydrophilicity is possible, because the hydrophobic surface (Si—H) of the storage electrode 124 reacts with $H_2O_2$ in the Piranha solution and generates $SiO_2$ after the wet etching process of the oxide film 118 in the BOE solution or BHF solution, as represented by the following reaction formula:

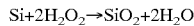
$$Si+2H_2O_2 \rightarrow SiO_2+2H_2O$$

The SC-1 solution consists of $NH_4OH$, $H_2O_2$ and $H_2O$. Preferably, the volume ratio of $NH_4OH$, $H_2O_2$ and $H_2O$ is in the range of 1:1:20 to 1:5:50, and the temperature of the SC-1 solution ranges from 25 to 85° C., and more preferably the volume ratio of $NH_4OH$, $H_2O_2$ and $H_2O$ is about 1:4:20, and the temperature of the SC-1 solution is 65° C.

In addition, the dryer is preferably an IPA steam dryer or Maragoni dryer. A spin dryer cannot be used since it generates bridging between cells due to the centrifugal force during a spin drying process.

Figure 2H:
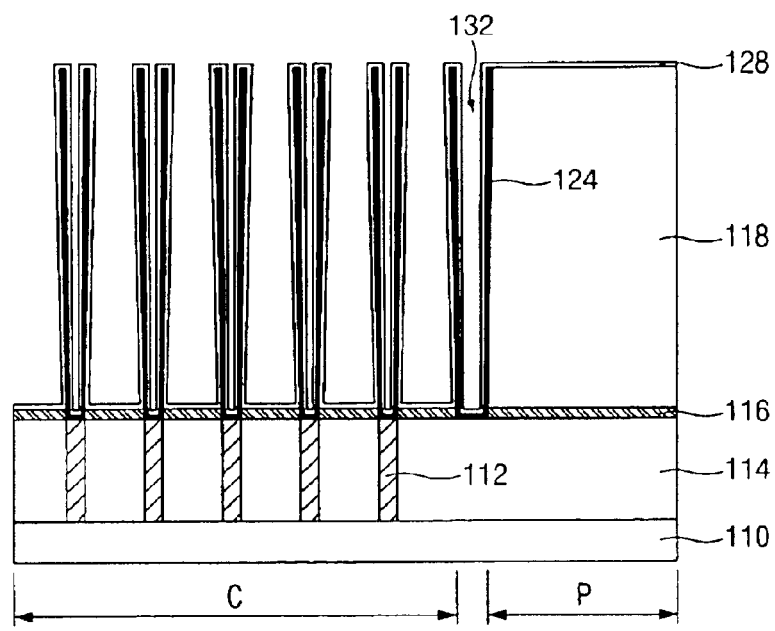

Referring to FIG. 2h, a dielectric film 128 is formed by depositing a dielectric material on the storage electrode 124.

Figure 2I:
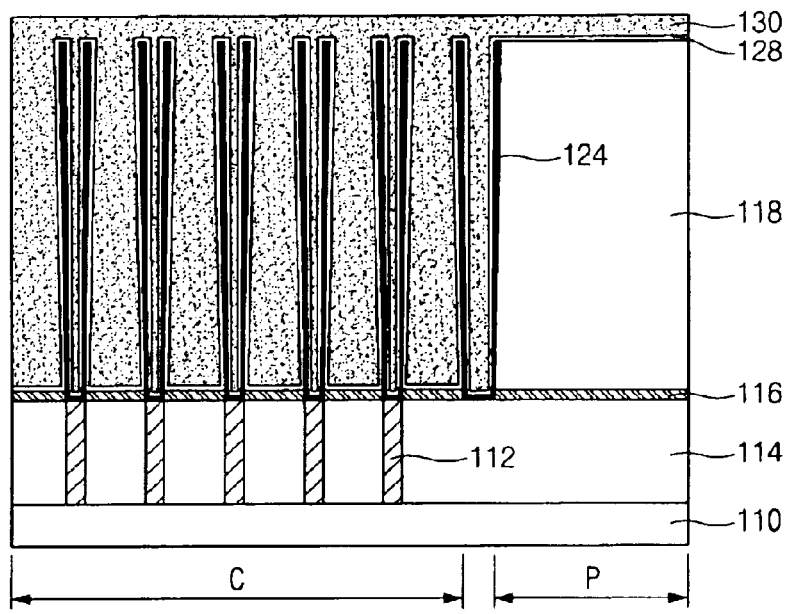

Referring to FIG. 2i, a plate electrode 130 is formed by depositing a polysilicon layer on the dielectric film 128.

Figure 2J:
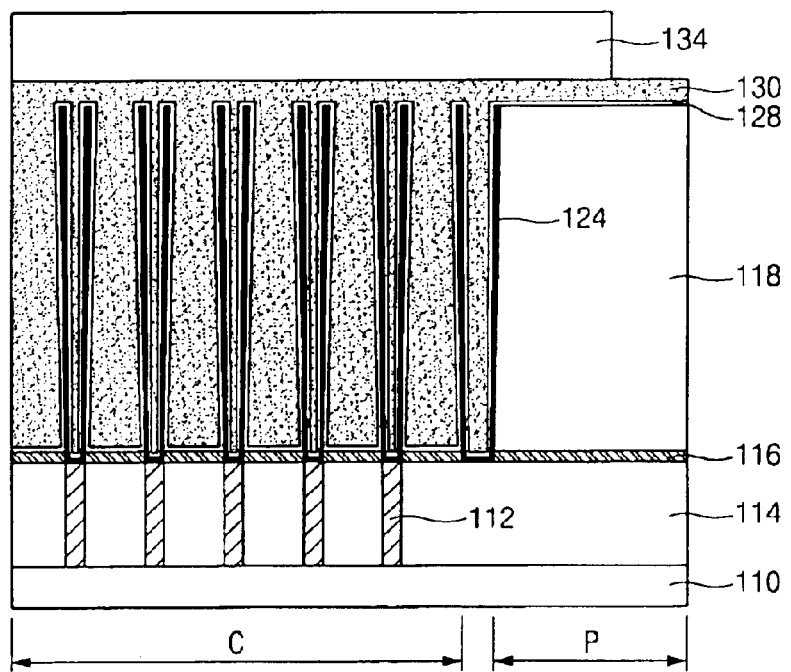

Referring to FIG. 2j, a photoresist film (not shown) is deposited on the entire surface of the resulting structure, and selectively exposed and developed, to form a plate mask 134 in a predetermined area on the plate electrode 130.

Figure 2K:
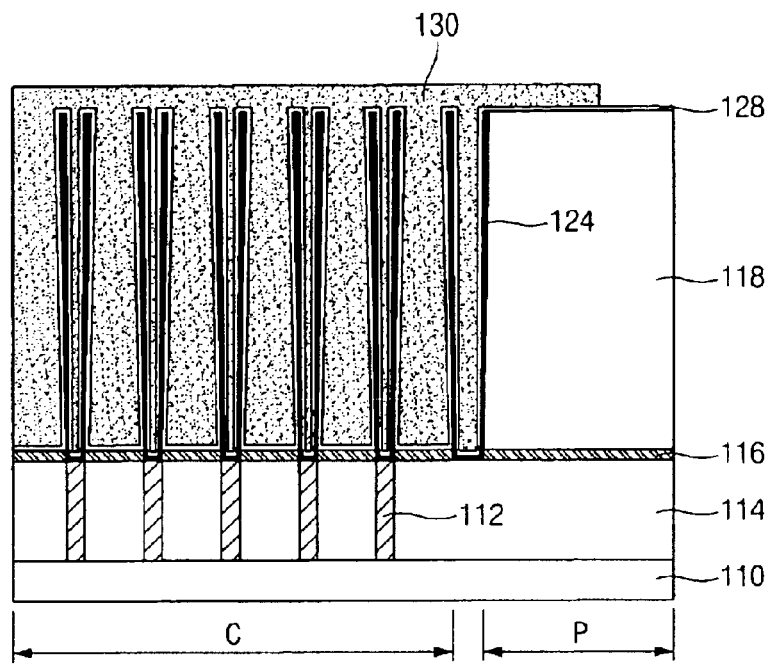

Referring to FIG. 2k, the exposed plate electrode 130 is etched using the plate mask 134, and then the plate mask 134 is removed.

Figure 2L:
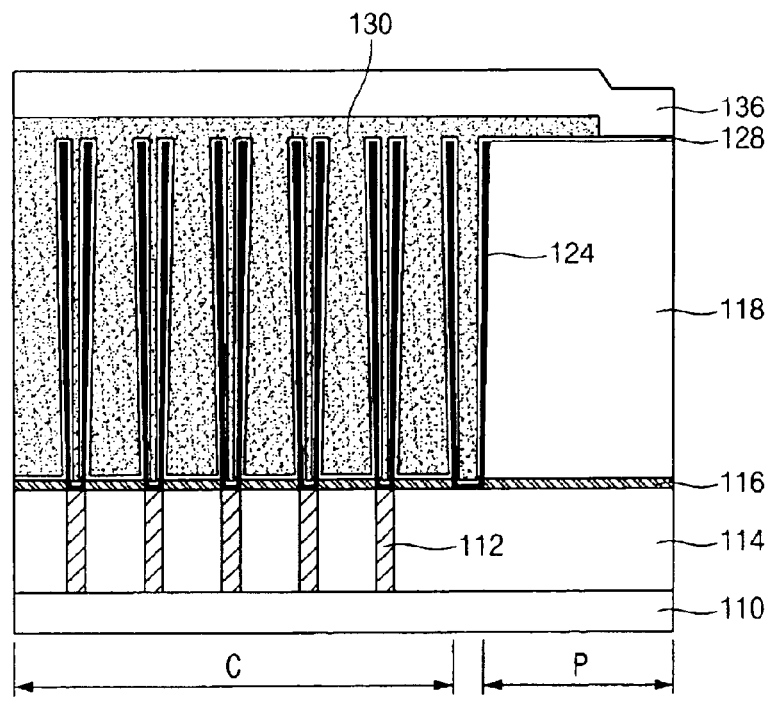

Referring to FIG. 2l, an interlayer insulating film 136 is formed on the entire surface of the resulting structure. Here, little step difference is generated between the interlayer insulating film 136 in the cell area C and the interlayer insulating film 136 in the peripheral circuit area P. Therefore, a subsequent process for removing the step difference is not needed.

The method for removing the oxide film in the cell area and the dip out mask will be explained by referring to Comparative Examples and Examples. However, the scope of the present invention is not limited to the Examples.

COMPARATIVE EXAMPLE 1

BOE solution bath→Dry etching process→Piranha solution bath→SC-1 solution bath→Diluted HF solution bath A semiconductor device including a cell area having a storage electrode formed therein and a peripheral circuit area having a dip out mask formed therein was prepared.

Figure 3A:
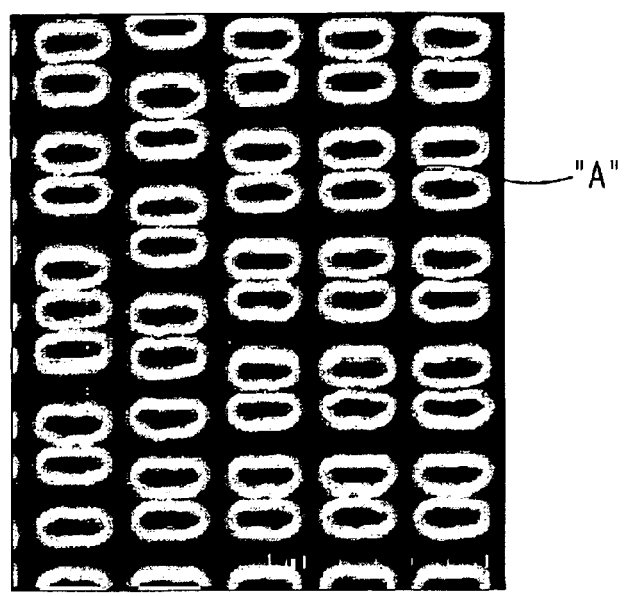
FIGS. 3a and 3b are plane and sectional photographs showing results of the wet etching process of the oxide film in the cell area in Comparative Example 1, respectively.
Figure 3B:
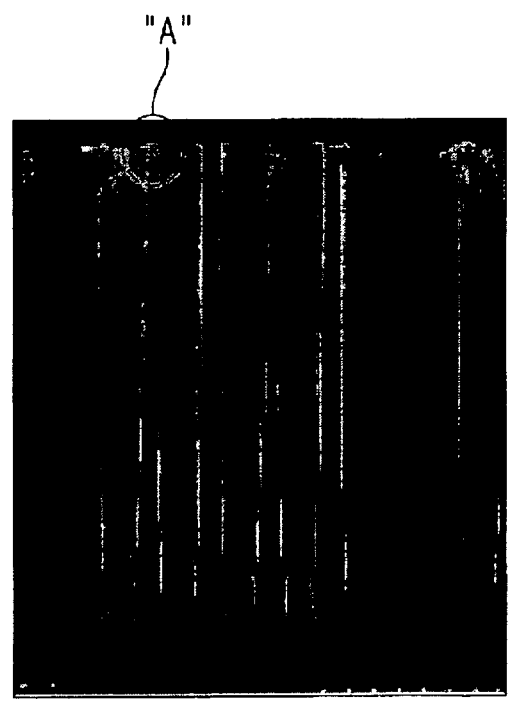

An oxide film in the cell area was removed in a BOE solution bath, and then the dip out mask was removed via a dry etching process. Thereafter, photoresist residues of the resulting structure were removed in a Piranha solution ($H_2SO_4:H_2O_2=4:1$ (volume ratio), at 120° C.) bath, and oxide film and photoresist residues were then removed by sequentially performing cleaning processes in an SC-1 solution bath and a diluted HF solution bath. As shown in FIGS. 3a and 3b, bridging (indicated by A) was generated between cells.

COMPARATIVE EXAMPLE 2

BHF solution bath→Pure water bath→Dryer→Dry etching process of dip out mask

A semiconductor device including a cell area having a storage electrode formed therein and a peripheral circuit area having a dip out mask formed therein was prepared.

An oxide film in the cell area was removed in a BHF solution (contains over 0.5% of HF) bath, and then the resulting structure was cleaned in a pure water bath and dried using an IPA steam dryer.

Figure 4A:
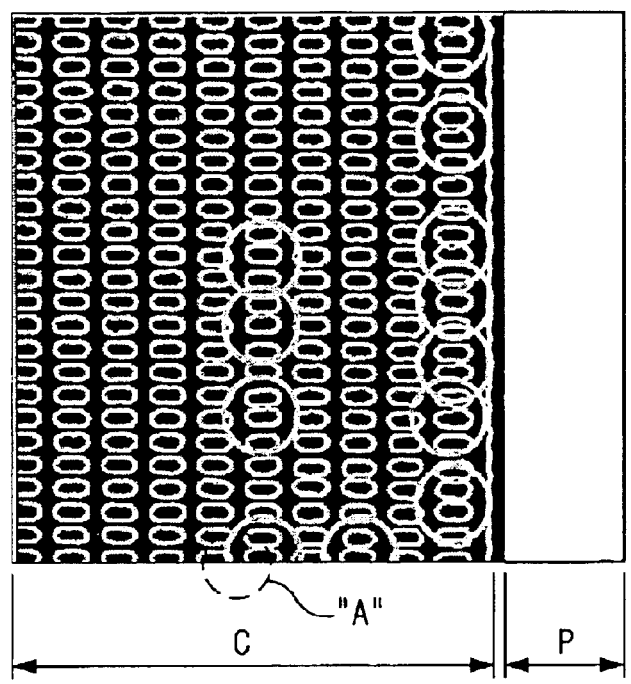
FIGS. 4a and 4b are plane and sectional photographs showing results of the wet etching process of the oxide film in the cell area in Comparative Example 2, respectively.
Figure 4B:
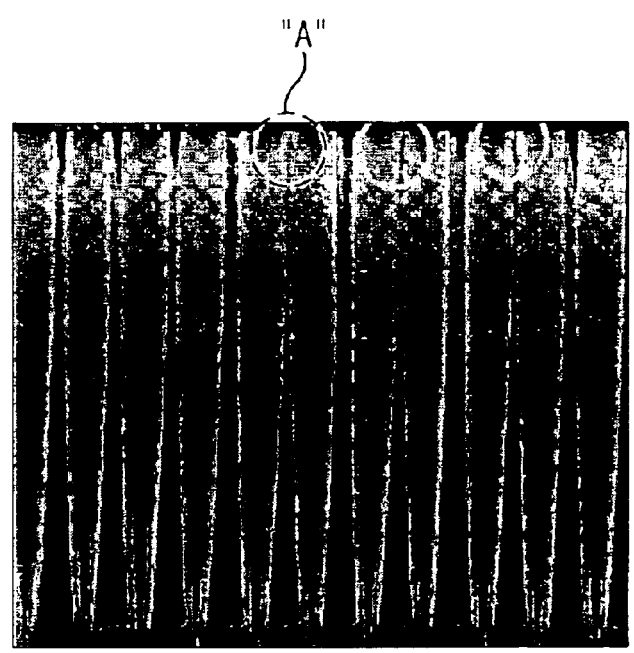

The dip out mask was then removed via a dry etching process. As shown in FIGS. 4a and 4b, bridging which is indicated as A, was generated between cells.

In the wet etching process of Comparative Example 2, since the polysilicon storage electrode is exposed, the surface of the storage electrode is subjected to the drying process in an Si—H hydrophobic state. The dip out mask dissolves in isopropyl alcohol since the IPA steam dryer is used. The dip out mask dissolved in isopropyl alcohol serves as a carbon source on the hydrophobic surface of the storage electrode, which causes drying failure due to water spots. Such drying failure results in bridging between cells.

EXAMPLE 1

BOE solution bath→Piranha solution bath→SC-1 solution bath→Dilluted HF solution bath A semiconductor device including a cell area having a storage electrode formed therein and a peripheral circuit area having a dip out mask formed therein was prepared. A wet etching process of the semiconductor device was performed in a single wet station including a BOE solution bath, a Piranha solution bath, an SC-1 solution bath and a diluted HF solution bath.

Figure 5A:
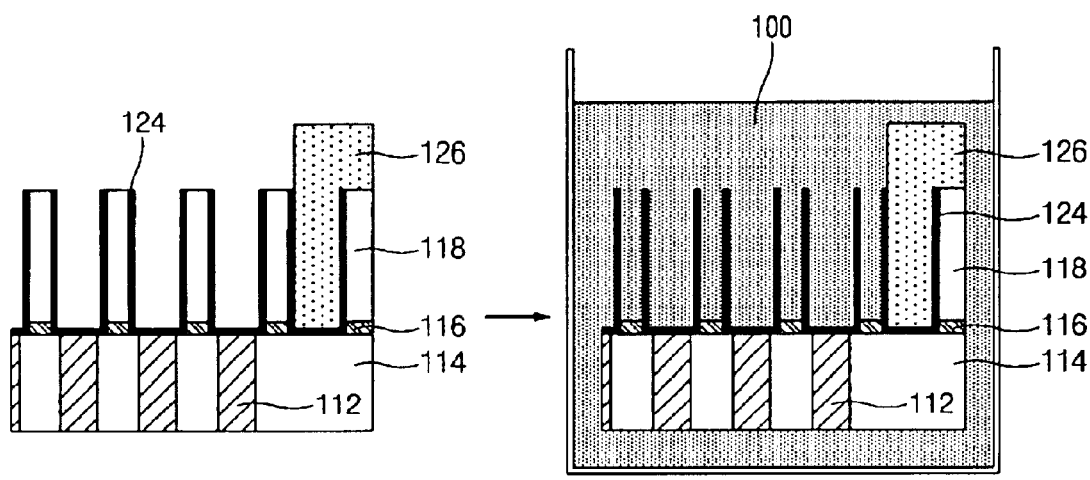
FIGS. 5a and 5b are cross-sectional diagrams illustrating portion of a wet etching process of an oxide film in a cell area in Example 1.
Figure 5B:
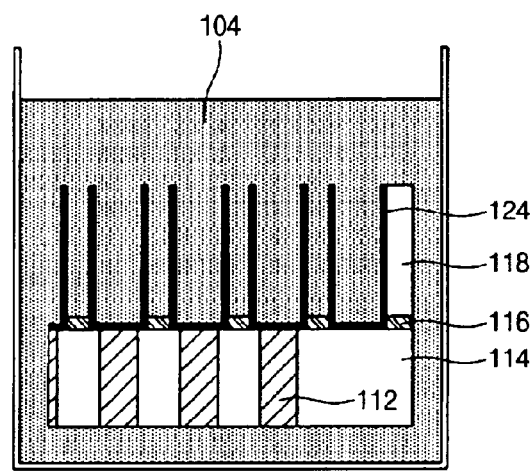

FIGS. 5a and 5b are cross-sectional diagrams illustrating portion of the wet etching process of the oxide film in the cell area.

Referring to FIG. 5a, the oxide film 118 in the cell area C is removed in the BOE solution bath 100 while the peripheral circuit area P is covered by the dip out mask 126.

Referring to 5b, the dip out mask 126 is removed in the Piranha solution ($H_2SO_4:H_2O_2=4:1$ (volume ratio), at 120° C.) bath 104, and the surface of the storage electrode 124 is oxidized, i.e. converted from hydrophobic to hydrophilic.

Figure 6A:
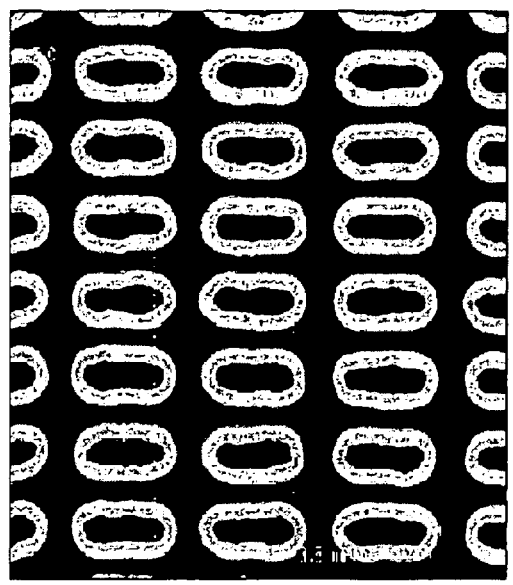
FIGS. 6a and 6b are plane and sectional photographs showing results of the wet etching process of the oxide film in the cell area in Example 1, respectively.
Figure 6B:

Thereafter, photoresist residues of the resulting structure were removed in the SC-1 solution ($NH_4OH:H_2O_2:H_2O=1:4:20$ (volume ratio), at 65° C.) bath, and oxide film and photoresist residues were then removed in the diluted HF solution bath. As shown in FIGS. 6a and 6b, bridging between cells did not occur in the resulting semiconductor device.

EXAMPLE 2

BHF solution bath→Pure water bath→Piranha solution bath→Pure water bath→Dryer

A semiconductor device including a cell area having a storage electrode formed therein and a peripheral circuit area having a dip out mask formed therein was prepared. A wet etching process of the semiconductor device was performed in a single wet station including a BHF solution bath, a pure water bath, a Piranha solution bath, a pure water bath and a dryer.

Figure 7A:
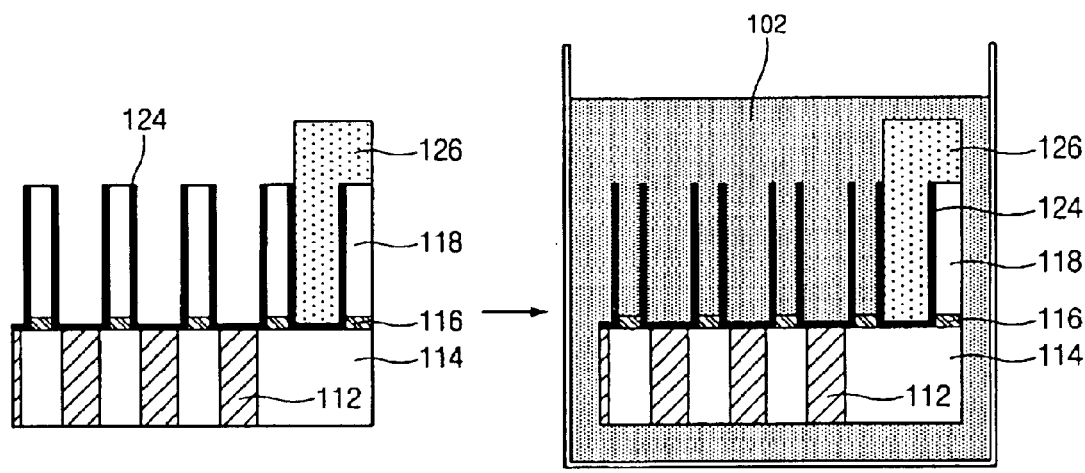
FIGS. 7a and 7b are cross-sectional diagrams illustrating portion of the wet etching process of the oxide film in the cell area in Examples 2, 3, 4 and 5.
Figure 7B:
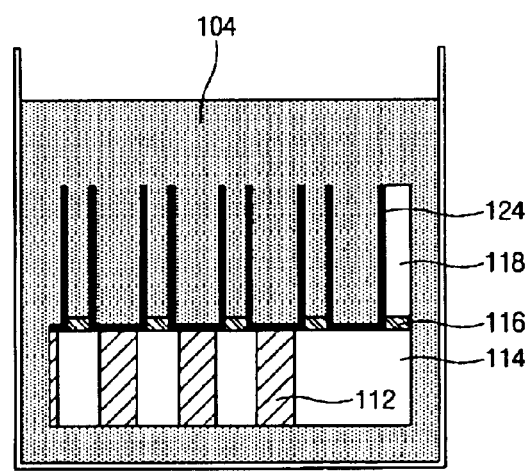

FIGS. 7a and 7b are cross-sectional diagrams illustrating portion of the wet etching process of the oxide film in the cell area.

Referring to FIG. 7a, the oxide film 118 in the cell area C is removed in the BHF solution bath 102 (contains over 0.5% of HF) while the peripheral circuit area P is covered by the dip out mask 126.

The resulting structure is cleaned in the pure water bath.

Referring to FIG. 7b, the dip out mask 126 is removed in the Piranha solution ($H_2SO_4:H_2O_2=4:1$ (volume ratio), at 120° C.) bath 104, and the surface of the storage electrode 124 is oxidized, i.e. converted from hydrophobic to hydrophilic.

Figure 8A:
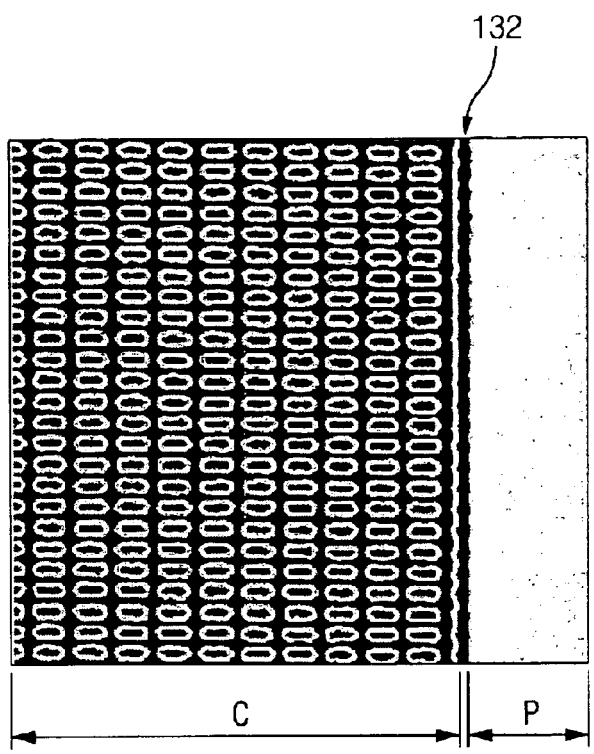
FIGS. 8a and 8b are plane and sectional photographs showing results of the wet etching process of the oxide film in the cell area in Example 2, respectively.
Figure 8B:
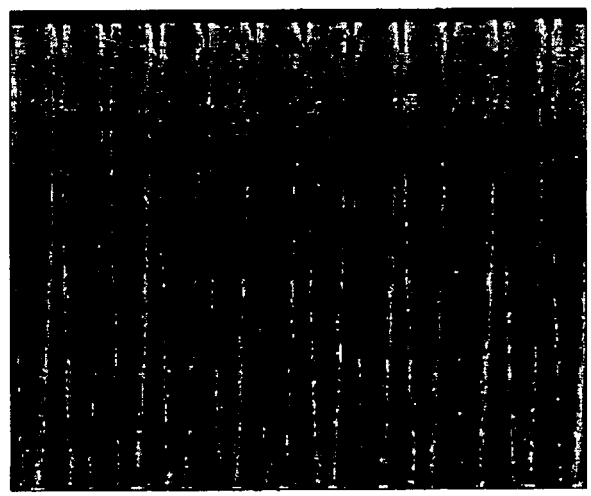

Thereafter, the resulting structure was cleaned in the pure water bath, and dried using an IPA stream dryer. As shown in FIGS. 8a and 8b, bridging between cells did not occur in the resulting semiconductor device.

EXAMPLE 3

BHF solution bath→Pure water bath→Piranha solution bath→Pure water bath→SC-1 solution bath→Pure water bath→Dryer A semiconductor device including a cell area having a storage electrode formed therein and a peripheral circuit area having a dip out mask formed therein was prepared. A wet etching process of the semiconductor device was performed in a single wet station including a BHF solution bath, a pure water bath, a Piranha solution bath, a pure water bath, an SC-1 solution bath, a pure water bath and a dryer.

FIGS. 7a and 7b are cross-sectional diagrams illustrating portion of the wet etching process of the oxide film in the cell area explained in the second example.

Referring to FIG. 7a, the oxide film 118 in the cell area C is removed in the BHF solution bath 102 (contains over 0.5% of HF) while the peripheral circuit area P is covered by the dip out mask 126.

The resulting structure is cleaned in the pure water bath.

Referring to FIG. 7b, the dip out mask 126 is removed in the Piranha solution ($H_2SO_4:H_2O_2=4:1$ (volume ratio), at 120° C.) bath 104, and the surface of the storage electrode 124 is oxidized, i.e. converted from hydrophobic to hydrophilic.

Thereafter, the resulting structure was cleaned in the pure water bath, photoresist residues were removed in the SC-1 solution ($NH_4OH:H_2O_2:H_2O=1:4:20$ (volume ratio), at 65° C.) bath, and the resulting structure was re-cleaned in the pure water bath and dried using an IPA stream dryer. As a result, bridging between cells did not occur in the resulting semiconductor device.

EXAMPLE 4

BHF solution bath→Pure water bath→Piranha solution bath→Pure water bath→SC-1 solution bath →Pure water bath→dilluted HF solution bath→Pure water bath→Dryer A semiconductor device including a cell area having a storage electrode formed therein and a peripheral circuit area having a dip out mask formed therein was prepared. A wet etching process of the semiconductor device was performed in a single wet station including a BHF solution bath, a pure water bath, a Piranha solution bath, a pure water bath, an SC-1 solution bath, a pure water bath, a diluted HF solution bath, a pure water bath and a dryer.

FIGS. 7a and 7b are cross-sectional diagrams illustrating portion of the wet etching process of the oxide film in the cell area explained in the second example.

Referring to FIG. 7a, the oxide film 118 in the cell area C is removed in the BHF solution bath 102 (contains over 0.5% of HF) while the peripheral circuit area P is covered by the dip out mask 126.

The resulting structure is cleaned in the pure water bath.

Referring to FIG. 7b, the dip out mask 126 is removed in the Piranha solution ($H_2SO_4:H_2O_2=4:1$ (volume ratio), at 120° C.) bath 104, and the surface of the storage electrode 124 is oxidized, i.e. converted from hydrophobic to hydrophilic.

Thereafter, the resulting structure was cleaned in the pure water bath, photoresist residues were removed in the SC-1 solution ($NH_4OH:H_2O_2:H_2O=1:4:20$ (volume ratio), at 65° C.) bath, the resulting structure was re-cleaned in the pure water bath, and photoresist and oxide film residues on the storage electrode were removed in the diluted HF solution bath.

Next, the resulting structure was cleaned in the pure water bath and dried using an IPA stream dryer. A subsequent deposition process of a dielectric film was performed via a conventional method. As a result, bridging between cells did not occur in the resulting semiconductor device.

EXAMPLE 5

BHF solution bath→Pure water bath→Piranha solution bath→Pure water bath→dilluted HF solution bath→Pure water bath→SC-1 solution bath→Pure water bath→Dryer A semiconductor device including a cell area having a storage electrode formed therein and a peripheral circuit area having a dip out mask formed therein was prepared. A wet etching process of the semiconductor device was performed in a single wet station including a BHF solution bath, a pure water bath, a Piranha solution bath, a pure water bath, a diluted HF solution bath, a pure water bath, an SC-1 solution bath, a pure water bath and a dryer.

FIGS. 7a and 7b are cross-sectional diagrams illustrating portion of the wet etching process of the oxide film in the cell area explained in the second example.

Referring to FIG. 7a, the oxide film 118 in the cell area C is removed in the BHF solution bath 102 (contains over 0.5% of HF) while the peripheral circuit area P is covered by the dip out mask 126.

The resulting structure is cleaned in the pure water bath.

Referring to FIG. 7b, the dip out mask 126 is removed in the Piranha solution ($H_2SO_4:H_2O_2=4:1$ (volume ratio), at 120° C.) bath 104, and the surface of the storage electrode 124 is oxidized, i.e. converted from hydrophobic to hydrophilic.

Thereafter, the resulting structure was cleaned in the pure water bath, photoresist residues and an oxide film on the surface of a storage electrode were removed in the diluted HF solution bath, the resulting structure was re-cleaned in the pure water bath, and particles were removed in the SC-1 solution ($NH_4OH:H_2O_2:H_2O=1:4:20$ (volume ratio), at 65° C.) bath.

Next, the resulting structure was cleaned in the pure water bath and dried using an IPA stream dryer. A subsequent deposition process of a dielectric film was performed via a conventional method. As a result, bridging between cells did not occur in the resulting semiconductor device.

As discussed above, step difference between the interlayer insulating film formed in the cell area and the interlayer insulating film formed in the peripheral circuit area is minimized by covering the peripheral circuit area by the photoresist film and selectively etching the oxide film in the cell area to form a cylindrical capacitor, thereby simplifying the manufacturing process.

In addition, bridging between the cells is prevented by performing a simple wet etching process using a single wet station, without performing a separate dry etching process for removing the oxide film and the photoresist film pattern, thereby improving the yield of the device.

What is claimed is:

1. A method for manufacturing a semiconductor device, the method comprising:

(a) forming an oxide film;

(b) etching the oxide film to define a storage electrode area;

(c) forming a storage electrode in the storage electrode area;

(d) forming a photoresist film pattern on the oxide film for storage electrode in the peripheral circuit area; and (e) removing the oxide film for storage electrode in the cell area via a wet etching process using the photoresist film pattern as a mask, and removing the photoresist film pattern to provide a resulting structure;

2. The method according to claim 1, wherein step (e) comprises removing the oxide film for the storage electrode in the cell area in a BOE (Buffered Oxide Etchant) solution bath using the photoresist film pattern as a mask, and removing the photoresist film pattern of the resulting structure in a Piranha solution bath, and further comprises cleaning the resulting structure in an SC-1 solution bath and cleaning the resulting structure in a diluted HF solution bath.

3. The method according to claim 2, wherein the Piranha solution comprises $H_2SO_4$ and $H_2O_2$, the volume ratio of the $H_2SO_4$ to $H_2O_2$ ranges from 2:1 to 6:1, and has a temperature ranging from 90 to 130° C.

4. The method according to claim 2, wherein the Piranha solution comprises $H_2SO_4$ and $H_2O_2$, the volume ratio of the $H_2SO_4$ to $H_2O_2$ is 4:1, and has a temperature of 120° C.

5. The method according to claim 2, wherein the SC-1 solution comprises $NH_4OH$, $H_2O_2$ and $H_2O$, the volume ratio of the $NH_4OH$, $H_2O_2$ and $H_2O$ ranging from 1:1:20 to 1:5:50, and has a temperature ranging from 25 to 85° C.

6. The method according to claim 2, wherein the SC-1 solution comprises $NH_4OH$, $H_2O_2$ and $H_2O$, the volume ratio of the $NH_4OH$, $H_2O_2$ and $H_2O$ is 1:4:20, and has a temperature of 65° C.

7. The method according to claim 1, wherein step (e) further comprises removing the oxide film for the storage electrode in the cell area in a BHF (Buffered Hydrogen Fluoride) solution bath by using the photoresist film pattern as a mask, cleaning the resulting structure in a pure water bath, and removing the photoresist film pattern of the resulting structure in a Piranha solution bath, and further comprises rinsing the resulting structure in a pure water bath, and drying the resulting structure in a dryer.

8. The method according to claim 7, wherein the Piranha solution comprises $H_2SO_4$ and $H_2O_2$, the volume ratio of the $H_2SO_4$ to $H_2O_2$ ranging from 2:1 to 6:1, and has a temperature ranging from 90 to 130° C.

9. The method according to claim 7, wherein the Piranha solution comprises $H_2SO_4$ and $H_2O_2$, the volume ratio of the $H_2SO_4$ to $H_2O_2$ is 4:1, and has a temperature of 120° C.

10. The method according to claim 7, further comprising cleaning the resulting structure in an SC-1 solution, and rinsing the resulting structure in a water bath, prior to the drying of the resulting structure in a dryer.

11. The method according to claim 7, further comprising rinsing the resulting structure in an SC-1 solution bath, rinsing the resulting structure in a water bath, rinsing the resulting structure in a diluted HF solution bath, and cleaning the resulting structure in a water bath, prior to the drying of the resulting structure in a dryer.

12. The method according to claim 7, further comprising cleaning the resulting structure in a diluted HF solution bath, rinsing the resulting structure in a water bath, cleaning the resulting structure in an SC-1 solution bath, and rinsing the resulting structure in a water bath, prior to the drying of the resulting structure in a dryer.

13. The method according to claim 10, wherein the SC-1 solution comprises $NH_4OH$, $H_2O_2$ and $H_2O$, the volume ratio of the $NH_4OH$, $H_2O_2$ and $H_2O$ ranging from 1:1:20 to 1:5:50, and has a temperature ranging from 25 to 85° C.

14. The method according to claim 10, wherein the SC-1 solution comprises $NH_4OH$, $H_2O_2$ and $H_2O$, the volume ratio of the $NH_4OH$, $H_2O_2$ and $H_2O$ is 1:4:20, and has a temperature of 65° C.

15. A method for manufacturing a semiconductor device, comprising:

(a) removing an oxide film for storage electrode in a cell area of a semiconductor substrate, wherein a storage electrode is disposed in the cell area, and a photoresist film pattern is disposed in peripheral circuit region of the semiconductor substrate by performing a wet etching process in a BHF (Buffered Hydrogen Fluoride) solution bath; and (b) removing the photoresist film pattern with a Piranha solution bath to provide a resulting structure.

16. The method according to claim 15, wherein the Piranha solution comprises $H_2SO_4$ and $H_2O_2$, the volume ratio of the $H_2SO_4$ to $H_2O_2$ ranging from 2:1 to 6:1, and has a temperature ranging from 90 to 130° C.

17. The method according to claim 15, wherein the Piranha solution comprises $H_2SO_4$ and $H_2O_2$, the volume ratio of the $H_2SO_4$ to $H_2O_2$ is 4:1, and has a temperature of 120° C.

18. The method according to claim 15, further comprising cleaning the resulting structure in an SC-1 solution bath, and rinsing the resulting structure in a water bath, prior to the drying of the resulting structure in a dryer.

19. The method according to claim 15, further comprising cleaning the resulting structure in an SC-1 solution bath, rinsing the resulting structure in a pure water bath, cleaning the resulting structure in a diluted HF solution bath, and rinsing the resulting structure in a pure water bath, prior to the drying of the resulting structure in a dryer.

20. The method according to claim 15, further comprising cleaning the resulting structure in a diluted HF solution bath, rinsing the resulting structure in a water bath, cleaning the resulting structure in an SC-1 solution bath, and rinsing the resulting structure in a pure water bath, prior to the drying of the resulting structure in a dryer.

21. The method according to claim 18, wherein the SC-1 solution comprises $NH_4OH$, $H_2O_2$ and $H_2O$, the volume ratio of the $NH_4OH$, $H_2O_2$ and $H_2O$ ranging from 1:1:20 to 1:5:50, and has a temperature ranging from 25 to 85° C.

22. The method according to claim 18, wherein the SC-1 solution comprises $NH_4OH$, $H_2O_2$ and $H_2O$, the volume ratio of the $NH_4OH$, $H_2O_2$ and $H_2O$ is 1:4:20, and has a temperature of 65° C.

23. The method according to claim 1, further comprising (f) sequentially forming a dielectric film and a plate electrode on the entire surface of the resulting structure.

24. The method of according to claim 23, further comprising (g) forming an interlayer insulating film on the entire surface of the resulting film an interior insulting film on the entire surface of the resulting structure.

* * * * *

UNITED STATES PATENT AND TRADEMARK OFFICE
CERTIFICATE OF CORRECTION

PATENT NO. : 6,893,914 B2
DATED : May 17, 2005
INVENTOR(S) : Gyu H. Kim et al.

It is certified that error appears in the above-identified patent and that said Letters Patent is hereby corrected as shown below:

Column 8,
Lines 47-48 and 49, please delete "for storage" and replace with -- for the storage --.

Column 9,
Lines 13 and 32-33, please delete "cleaning" and replace with -- rinsing --.
Lines 30 and 31, please delete "rinsing" and replace with -- cleaning --.

Column 10,
Line 1, please delete "for storage" and replace with -- for a storage --.
Line 2, please delete "wherein a storage" and replace with -- wherein the storage --.
Lines 24, 26 and 32, please delete "a pure water" and replace with -- a water --.
Lines 47-48, please delete "resulting film an interior insulating film on the entire surface of the resulting structure" and replace with -- resulting structure --.

Signed and Sealed this

Sixth Day of September, 2005

JON W. DUDAS
*Director of the United States Patent and Trademark Office*